United States Patent
Liang et al.

(10) Patent No.: US 9,013,003 B2
(45) Date of Patent: Apr. 21, 2015

(54) SEMICONDUCTOR STRUCTURE AND PROCESS THEREOF

(71) Applicant: United Microelectronics Corp., Hsin-Chu (TW)

(72) Inventors: Chia-Jui Liang, Tainan (TW); Po-Chao Tsao, New Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/728,948

(22) Filed: Dec. 27, 2012

(65) Prior Publication Data

US 2014/0183642 A1  Jul. 3, 2014

(51) Int. Cl.
| H01L 27/088 | (2006.01) |
| H01L 27/092 | (2006.01) |
| H01L 21/336 | (2006.01) |
| H01L 29/66 | (2006.01) |
| H01L 21/8234 | (2006.01) |

(52) U.S. Cl.
CPC ........ *H01L 29/66477* (2013.01); *H01L 27/088* (2013.01); *H01L 21/823412* (2013.01); *H01L 21/823418* (2013.01); *H01L 21/823462* (2013.01); *H01L 21/823468* (2013.01)

(58) Field of Classification Search
CPC ............ H01L 27/088; H01L 29/66477; H01L 21/823412; H01L 21/823418; H01L 21/821462; H01L 21/823468
USPC ............ 257/368, 391, 392, 396, 410, E27.06, 257/E27.062, E29.242, E21.409; 438/151, 438/275, 299, 595
See application file for complete search history.

(56) References Cited

U.S. PATENT DOCUMENTS

| 8,354,313 | B2 * | 1/2013 | Kwon et al. | 438/199 |
| 8,530,974 | B2 * | 9/2013 | Cheng et al. | 257/369 |
| 2006/0263948 | A1 * | 11/2006 | Maekawa | 438/142 |
| 2011/0156154 | A1 * | 6/2011 | Hoentschel et al. | 257/369 |
| 2012/0132998 | A1 * | 5/2012 | Kwon et al. | 257/369 |
| 2012/0309171 | A1 | 12/2012 | Lu | |
| 2013/0187236 | A1 * | 7/2013 | Xie et al. | 257/369 |
| 2013/0217190 | A1 * | 8/2013 | Jagannathan et al. | 438/151 |
| 2013/0307086 | A1 * | 11/2013 | Koburger et al. | 257/392 |
| 2013/0323891 | A1 * | 12/2013 | Tsai et al. | 438/198 |

OTHER PUBLICATIONS

Chung-Fu Chang et al., Title: Semiconductor Process, pending U.S. Appl. No. 13/270,240, filed Oct. 11, 2011.

* cited by examiner

*Primary Examiner* — Dao H Nguyen
(74) *Attorney, Agent, or Firm* — Winston Hsu; Scott Margo

(57) ABSTRACT

A semiconductor structure includes a first gate and a second gate, a first spacer and a second spacer, two first epitaxial structures and two second epitaxial structures. The first gate and the second gate are located on a substrate. The first spacer and the second spacer are respectively located on the substrate beside the first gate and the second gate. The first epitaxial structures and the second epitaxial structures are respectively located in the substrate beside the first spacer and the second spacer, wherein the first spacer and the second spacer have different thicknesses, and the spacing between the first epitaxial structures is different from the spacing between the second epitaxial structures. Moreover, the present invention also provides a semiconductor process forming said semiconductor structure.

12 Claims, 6 Drawing Sheets

SEMICONDUCTOR STRUCTURE AND PROCESS THEREOF

BACKGROUND OF THE INVENTION

1. Field of the Invention

The present invention relates generally to a semiconductor structure and process thereof, and more specifically to a semiconductor structure and process thereof that includes at least two transistors having different spacers.

2. Description of the Prior Art

For decades, chip manufacturers have made metal-oxide-semiconductor (MOS) transistors faster by making them smaller. As the semiconductor processes advance to the very deep sub micron era such as 65-nm node or beyond, how to increase the driving current for MOS transistors has become a critical issue. In order to improve device performance, crystal strain technology has been developed. Crystal strain technology is becoming more and more attractive as a means for getting better performance in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel.

Attempts have been made to use a strained silicon layer, which has been grown epitaxially on a silicon substrate with a silicon germanium (SiGe) structure or a silicon carbide (SiC) structure disposed therebetween. In this type of MOS transistor, a biaxial tensile strain occurs in the epitaxy silicon structure due to the silicon germanium or silicon carbide having a larger or smaller lattice constant than silicon; as a result, the band structure alters, and the carrier mobility increases. This enhances the speed performance of the MOS transistors.

As epitaxial structures such as the silicon germanium (SiGe) structure or silicon carbide (SiC) structure are applied in transistors in different types of electrical circuit areas (such as a logical electrical circuit area or a high voltage electrical circuit area), the electrical performances of the transistors in each area induced by the epitaxial structures may not be the same, for reasons related to size, structure or forming methods of gate structures in each area. The electrical demands and the applications of the transistors in different electrical circuit areas may also be different.

Therefore, an important issue in the current semiconductor industry is how to form transistors in electrical circuit which apply crystal strain technology using a simplified process that can still reach desired electrical standards.

SUMMARY OF THE INVENTION

The present invention therefore provides a semiconductor structure and process thereof which forms spacers having different thicknesses on a substrate besides two gate structures to thereby improve electrical performances of formed transistors.

The present invention provides a semiconductor structure including a first gate and a second gate, a first spacer and a second spacer, two first epitaxial structures and two second epitaxial structures. The first gate and the second gate are located on a substrate. The first spacer and the second spacer are respectively located on the substrate beside the first gate and the second gate. The two first epitaxial structures and the two second epitaxial structures are respectively located in the substrate beside the first spacer and the second spacer, wherein the first spacer and the second spacer have different thicknesses, and the spacing between the two first epitaxial structures is different from the spacing between the two second epitaxial structures.

The present invention provides a semiconductor process including the following steps. A first gate and a second gate are formed on a substrate. An internal spacer of a second spacer is formed on the substrate beside the second gate. A first spacer and an outer spacer of the second spacer are formed simultaneously on the substrate beside the first gate and on the internal spacer respectively. Four recesses are formed simultaneously in the substrate beside the first spacer and the second spacer.

According to the above, the present invention provides a semiconductor structure and process thereof which forms spacers having different thicknesses on the substrate beside two gate structures. This enables epitaxial structures formed in the substrate beside the two spacers to have different spacing in the gate channel length direction (or to have different distances between each of epitaxial structure and each gate), thereby improving electrical performances of transistors with different standards; for example, in different electrical circuit areas.

These and other objectives of the present invention will no doubt become obvious to those of ordinary skill in the art after reading the following detailed description of the preferred embodiment that is illustrated in the various figures and drawings.

DETAILED DESCRIPTION

In the following described embodiments, the semiconductor process of the present invention is applied in a gate last for high-K last, buffer layer last process, but the present invention is not restricted to this. For simplifying the present invention, only two transistors are described in the following embodiments, but the number of transistors is not restricted to two.

Figure 1:
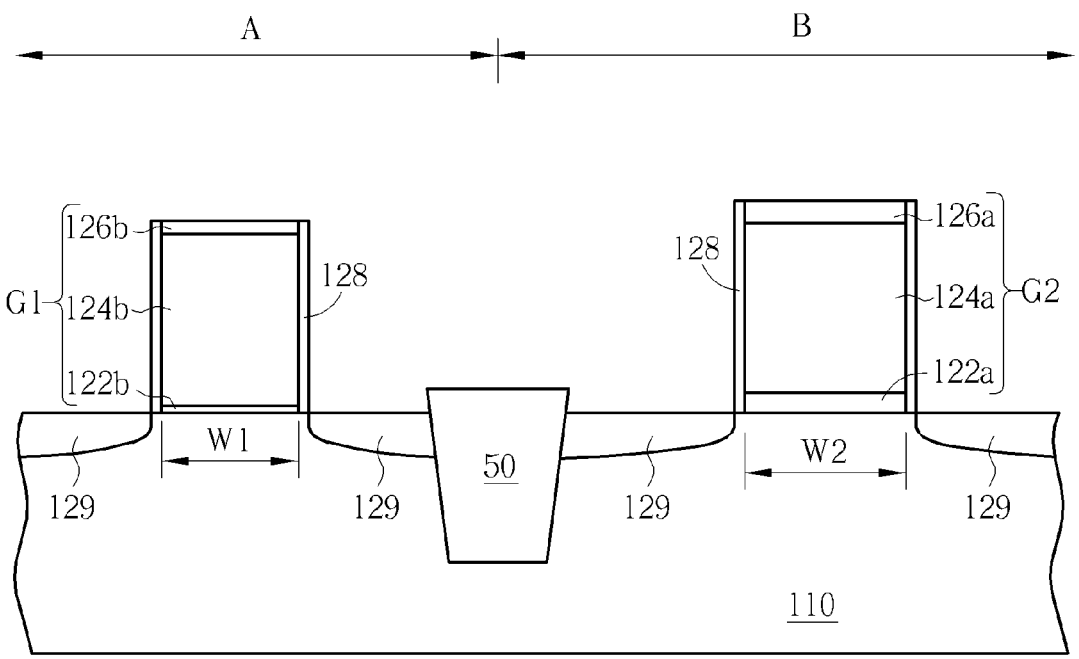
FIGS. 1-11 schematically depict cross-sectional views of a semiconductor process according to an embodiment of the present invention.

FIGS. 1-11 schematically depict cross-sectional views of a semiconductor process according to an embodiment of the present invention. As shown in FIG. 1, a first gate G1 and a second gate G2 are formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 includes a first area A and a second area B. In this embodiment, the first gate G1 is located in the first area A and the second gate G2 is located in the second area B, and the first area A is a logical electrical circuit area while the second area B is a high voltage electrical circuit area, but the invention is not limited thereto. The size of the first gate G1 in this embodiment is smaller than the size of the second gate G2, and the width W1 of the first gate G1 in the gate channel length direction is shorter than the width W2 of the second G2 gate in the gate channel length direction, but the invention is not limited thereto.

Forming the first gate G1 and the second gate G2 having different sizes on the substrate 110 may include the following steps. A pad oxide layer (not shown) and a nitride layer (not shown) are sequentially formed on the substrate 110. Then, a photolithography process and a polishing process using the nitride layer as a polish stop layer are performed to form a planarized isolating structure 50. The nitride layer and the pad oxide layer are sequentially removed, so the planarized isolating structure 50 protruding from the substrate 110 is formed. In another embodiment, the planarized isolating structure 50 may be an isolating structure such as a field oxide (FOX), but the invention is not limited thereto. A dielectric layer (not shown) is entirely formed on the substrate 110 in the first area A and the second area B. The dielectric layer may be formed by an in-situ steam generation (ISSG) process or a thermal oxide process, but the invention is not limited thereto. Then, the dielectric layer in the first area A is removed but retaining the dielectric layer in the second area B. A dielectric layer (not shown) thinner than the dielectric layer is reformed on the substrate 110 in the first area A. Therefore, the dielectric layer having different thicknesses can be respectively formed in the first area A and the second area B.

As shown in FIG. 1, a sacrificial electrode layer (not shown) and a cap layer (not shown) are sequentially formed on the two dielectric layers. Then, the cap layer (not shown), the sacrificial electrode layer (not shown) and the dielectric layer are patterned, so the first gate G1 formed on the substrate 110 in the first area A and the second gate G2 formed on the substrate 110 in the second area B can be respectively formed. The first gate G1 includes a dielectric layer 122b, a sacrificial electrode layer 124b and a cap layer 126b stacked from bottom to top, and the second gate G2 includes a dielectric layer 122a, a sacrificial electrode layer 124a and a cap layer 126a stacked from bottom to top.

A spacer 128 is respectively formed on the substrate 110 beside the first gate G1 and the second gate G2. The spacer 128 may be a single layer structure, a multilayer structure composed of silicon nitride or silicon oxide, etc. A lightly doped ion implantation process is performed to respectively form a lightly doped source/drain region 129 in the substrate 110 beside the spacers 128. The dopants of the lightly doped ion implantation process may be trivalent ions or pentavalent ions such as boron or phosphorus etc., depending upon the electrical types of the first gate G1 and the second gate G2. In this embodiment, the first gate G1 and the second gate G2 have the same conductive type but are of different sizes, so that the source/drain regions 129 of the first gate G1 and the second gate G2 have the same conductive type ions but may have other different kinds of ions. In another embodiment, however, the first gate G1 and the second gate G2 may have different conductive types.

Figure 2:
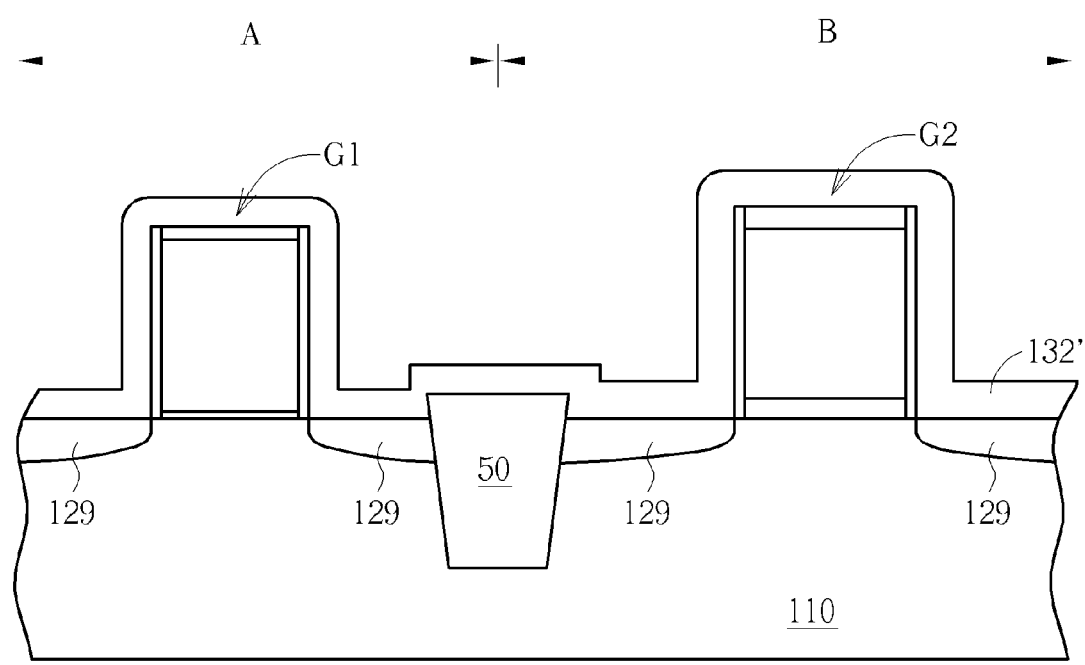
Figure 3:
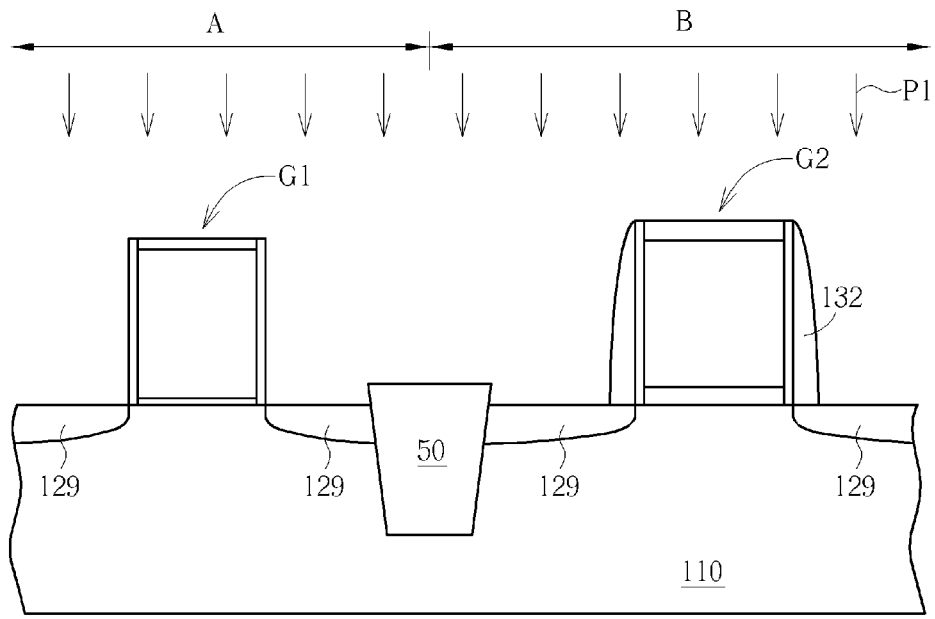

As shown in FIG. 2, an internal spacer material 132' entirely covers the first gate G1, the second gate G2 and the substrate 110. As shown in FIG. 3, at least an etching process P1 is performed to etch the internal spacer material 132', so that an internal spacer 132 on the substrate 110 beside the second gate G2 is formed while the internal spacer material 132' surrounding the first gate G1 (or in the first area A) is entirely removed. The internal spacer material 132' may be composed of silicon nitride, silicon oxide or carbon containing silicon nitride etc., and may be a single layer or multilayer structure.

Figure 4:
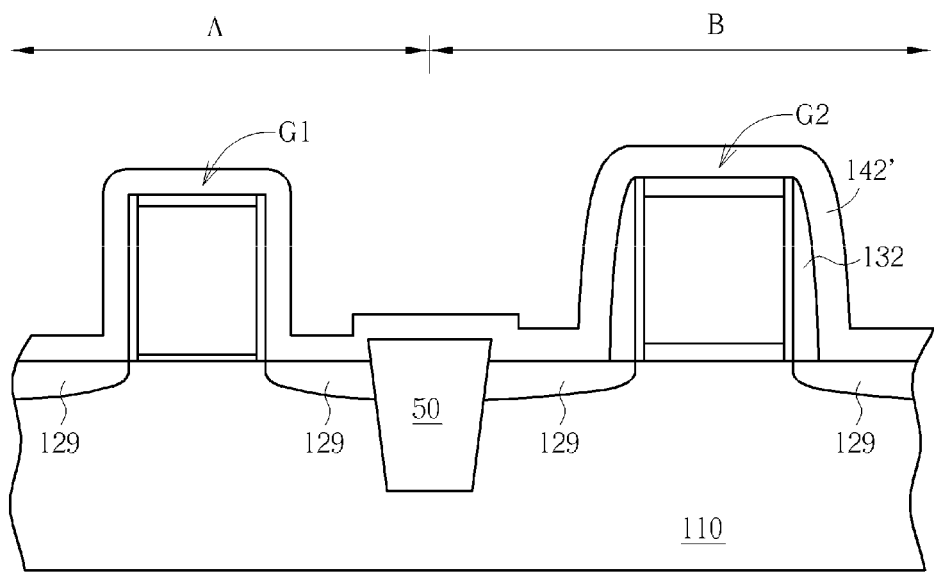
Figure 5:
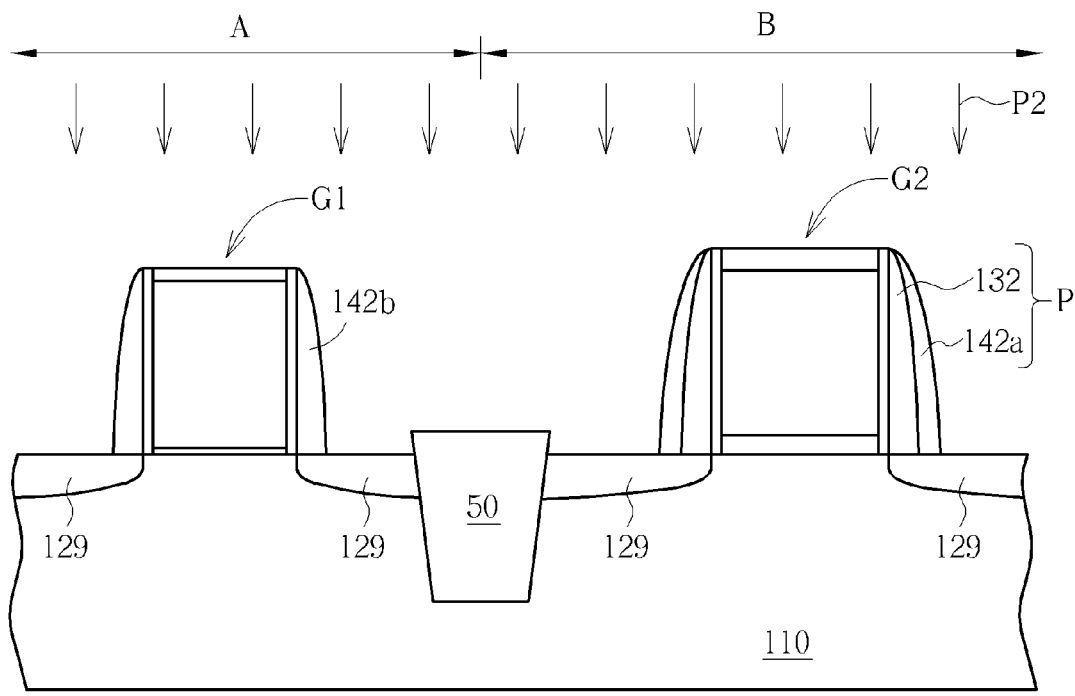

As shown in FIG. 4, an outer spacer material 142' entirely covers the first gate G1, the second gate G2, the internal spacer 132 and the substrate 110. As shown in FIG. 5, an etching process P2 is performed to etch the outer spacer material 142', so that the first spacer 142b on the substrate 110 beside the first gate G1 and the outer spacer 142a on the internal spacer 132 are formed. The outer spacer material 142' may be composed of silicon nitride, silicon oxide or carbon containing silicon nitride, etc.

Thus, as shown in FIGS. 2-5, the first spacer 142b, the internal spacer 132 and the outer spacer 142a all have a boat-shaped cross-sectional profile. In another embodiment, the internal spacer material 132' and the outer spacer material 142' are sequentially deposited; the internal spacer material 132' and the outer spacer material 142' in the first area A are etched and entirely removed while the internal spacer material 132' and the outer spacer material 142' in the second area B remain; the internal spacer material 132' and the outer spacer material 142' in the second area B are patterned, so that the internal spacer 132 and part of the outer spacer 142a beside the second gate G2 are simultaneously formed; then, the first spacer 142b on the substrate 110 beside the first gate G1 is formed. It is possible that the internal spacer material 132' and the outer spacer material 142' are sequentially deposited; the internal spacer material 132' and the outer spacer material 142' in the first area A and the second area B are patterned, so that the internal spacer 132 and the outer spacer 142a beside the first gate G1 and the second gate G2 are formed at the same time; then, the outer spacer material 142' in the first area A is removed. The internal spacer formed by these methods has an L-shaped cross-sectional profile. In addition, the internal spacer may have a boat-shaped cross-sectional profile, an L-shaped cross-sectional profile or other shaped cross-sectional profiles by other forming methods; these methods are not limited thereto, provided that the spacers beside the first gate G1 and the second gate G2 have different thicknesses.

In this embodiment, the internal spacer 132 and the outer spacer 142a in the second area B constitute a second spacer P, which is a dual spacer, while the first spacer 142b in the first area A is a single spacer, wherein the thickness of the second spacer P beside the second gate G2 is larger than the thickness of the first spacer 142b beside the first gate G1. The outer spacer 142a and the first spacer 142b are of the same material. In one embodiment, the internal spacer 132 and the outer spacer 142a may be of different materials. For example, the internal spacer 132 is an oxide spacer, while the outer spacer 142a is a nitride spacer, but the invention is not limited thereto. In another embodiment, the internal spacer 132 and the outer spacer 142a are of the same material. For instance, the internal spacer 132 and the outer spacer 142a are all oxide spacers or nitride spacers, but the invention is not limited thereto. In a preferred embodiment, a buffer layer (not shown) may be located between the internal spacer 132 and the outer spacer 142a and used for being an etching stop layer during the time in which the outer spacer 142a is formed. As the internal spacer 132 and the outer spacer 142a are of the same material, the etching process for forming the outer spacer 142a has a low etching selectivity with respect to the internal spacer 132 and the outer spacer 142a, meaning that a buffer layer (not shown) is needed to prevent the internal spacer 132 from being etched in the case that over-etching occurs.

Figure 6:
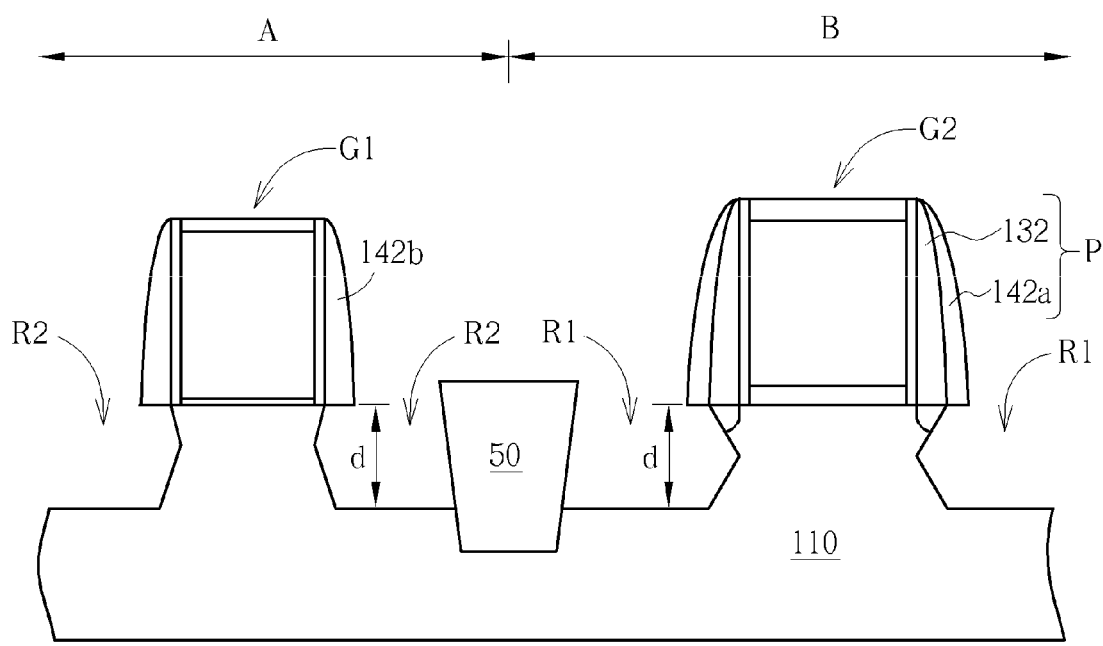

As shown in FIG. 6, an etching process is performed to form four recesses R1 and R2 respectively in the substrate 110 beside the first spacer 142b and the second spacer P at the same time, wherein the two recesses R2 are located in the substrate 110 beside the first spacer 142b while the two recesses R1 are located in the substrate 110 beside the second spacer P. The recesses R1 and R2 may be formed by a dry etching process, a wet etching process or both processes. For example, a dry etching process is performed to etch a recess having a predetermined depth and then a wet etching process is performed to etch specific crystal surfaces to obtain the recesses R1 and R2 having depth d and desired profiles.

Figure 7:
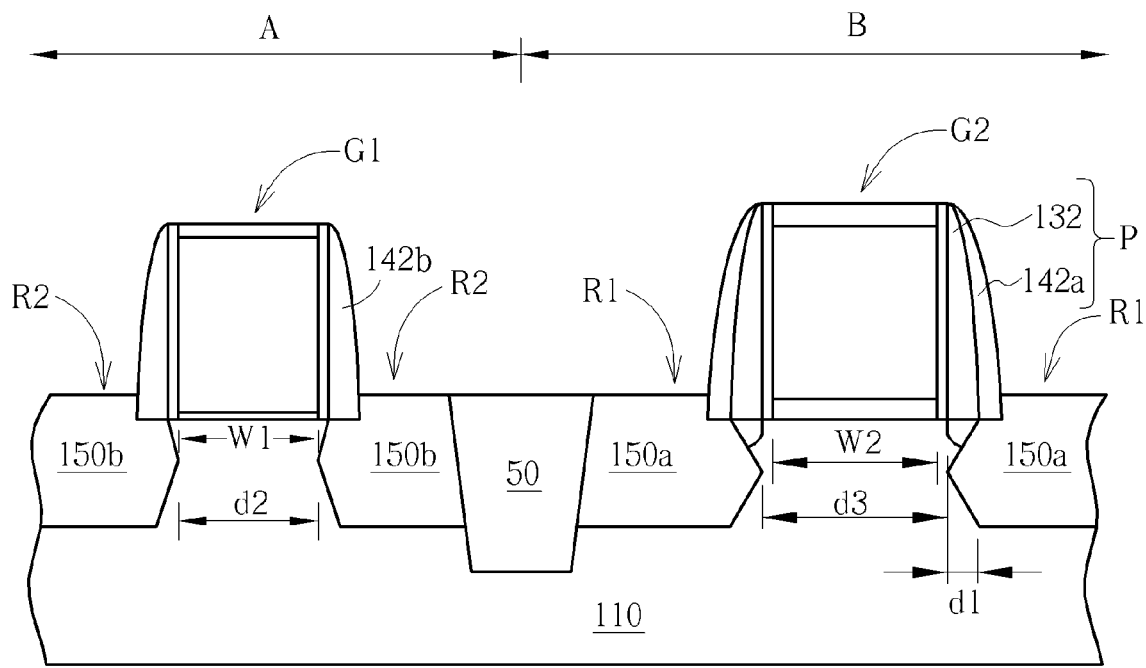

As shown in FIG. 7, two first epitaxial structures 150b are formed in the two recesses R2 beside the first spacer 142b while two second epitaxial structures 150a are formed in the two recesses R1 beside the second spacer P. The first epitaxial structures 150b and the second epitaxial structures 150a may be a silicon germanium epitaxial structure, a silicon carbide epitaxial structure, a silicon phosphorus epitaxial structure or a carbon doped silicon phosphorus epitaxial structure, etc. In this embodiment, due to the first gate G1 and the second gate G2 having the same conductive type, the first epitaxial structures 150b and the second epitaxial structures 150a may all be silicon germanium epitaxial structures for forming a PMOS transistor; or may all be silicon carbide epitaxial structures, silicon phosphorus epitaxial structures or carbon doped silicon phosphorus epitaxial structures for forming an NMOS transistor. Moreover, due to the first area A of the present invention being a logical electrical circuit area and the second area B being a high voltage electrical circuit area, the size of the first gate G1 is smaller than the size of the second gate G2. Therefore, the sizes of the first epitaxial structures 150b in the recesses R2 should be smaller than the sizes of the second epitaxial structures 150a in the recesses R1.

It is emphasized that the first spacer 142b of the present invention is a single spacer, which is formed by the same process as the outer spacer 142a of the second spacer P, and the second spacer P is a dual spacer further including an internal spacer 132. Further, the width W1 of the first gate G1 in the gate channel length direction is shorter than the width W2 of the second gate G2 in the gate channel length direction. Therefore, the spacing d2 between the first epitaxial structures 150b formed after each of the spacers is different from the spacing d3 between the second epitaxial structures 150a. In this embodiment, the spacing d2 between the first epitaxial structures 150b is smaller than the spacing d3 between the second epitaxial structures 150a. In another embodiment, even if the size of the first gate G1 is common to the size of the second gate G2, meaning that the width W1 of the first gate G1 at the direction of the gate channel length is equal to the width W2 of the second gate G2 at the direction of the gate channel length, the spacing d2 between the first epitaxial structures 150b is still different from the spacing d3 between the second epitaxial structures 150a because the first spacer 142b of the present invention is a single spacer, which is formed by the same process as the outer spacer 142a of the second spacer P, and the second spacer P is a dual spacer further including an internal spacer 132. Preferably, the minimum distance between each of the first epitaxial structures 150b and the first gate G1 is zero while the minimum distance between each of the second epitaxial structures 150a and the second gate G2 is d1. In an ideal case, the distance d1 is the width of the internal spacer 132.

Figure 8:
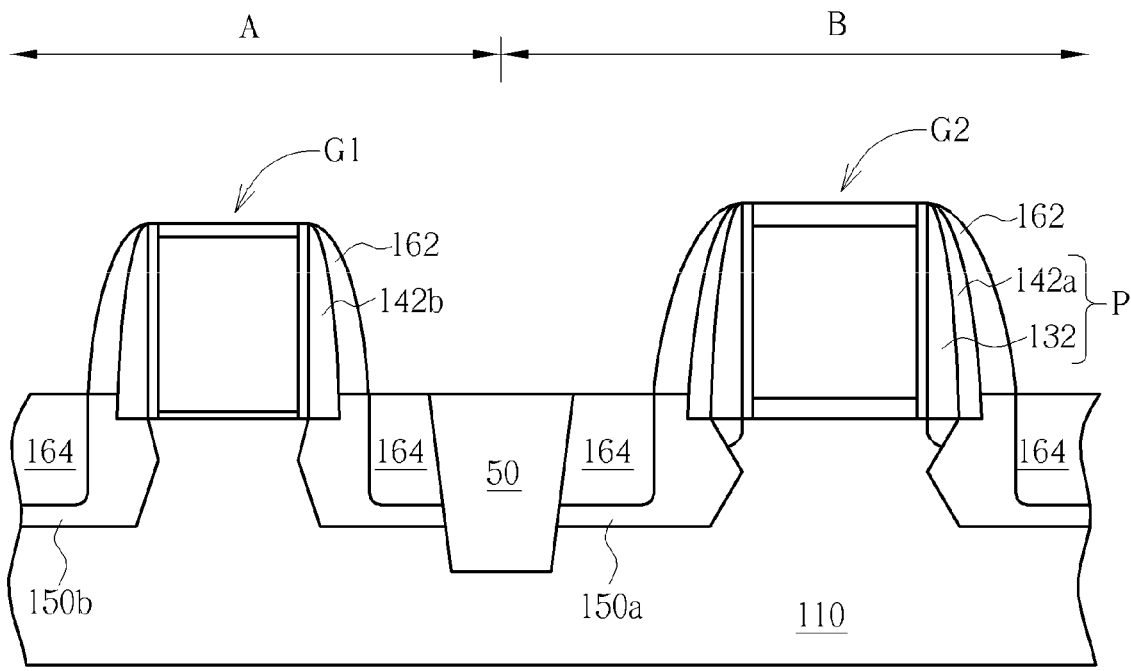

As shown in FIG. 8, a main spacer 162 is respectively formed on the substrate 110 beside the first spacer 142b and on the substrate 110 beside the second spacer P simultaneously. Then, an ion implantation process is performed to respectively form a source/drain region 164 in the substrate 110 beside each of the main spacers 162. The dopants of the ion implantation process may be trivalent or pentavalent ions such as boron or phosphorus, depending upon the electrical types of the first gate G1 and the second gate G2. In this embodiment, the first epitaxial structures 150b and the second epitaxial structures 150a are formed and then the source/drain regions 164 are formed; in another embodiment, the source/drain regions 164 are formed and then the first epitaxial structures 150b and the second epitaxial structures 150a are formed; it is also possible that the source/drain regions 164 and the first epitaxial structures 150b and the second epitaxial structures 150a are formed simultaneously.

Figure 9:
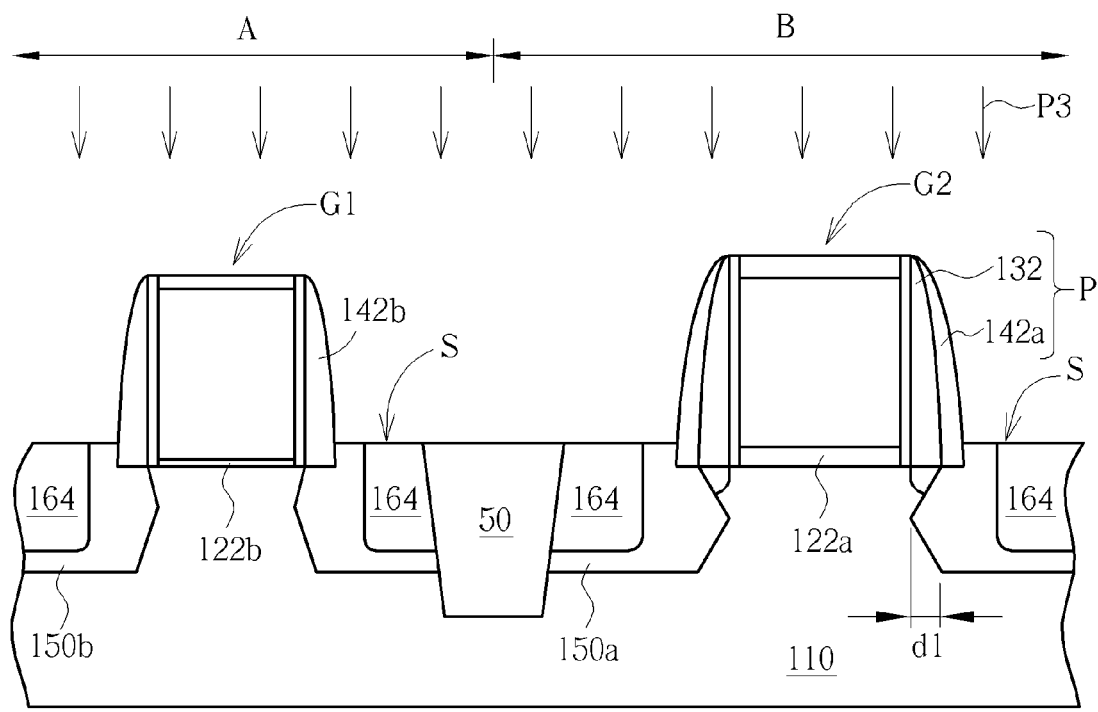

The main spacers 162 beside the first spacer 142b and the second spacer P may be removed simultaneously as shown in FIG. 9. A pre-cleaning process P3 is then performed to clean the surface S of the substrate 110 or the first epitaxial structures 150b and the second epitaxial structures 150a. Specifically, the pre-cleaning process P3 may be a nitrogen trifluoride and ammonia containing cleaning process, which is used to clean oxides on the surface S of the substrate 110 or the first epitaxial structures 150b and the second epitaxial structures 150a. Due to the dielectric layer 122a being an oxide, the cleaning solution of the pre-cleaning process P3 used for cleaning the surface S could cause serious damage. In this embodiment, however, the cleaning solution of the pre-cleaning process P3 will not flow into the dielectric layer 122a through the second epitaxial structures 150a and the substrate 110 thanks to the minimum distance d1 between the second epitaxial structures 150a and the second gate G2.

Furthermore, although the minimum distance between the first epitaxial structures 150b and the first gate G1 is zero, a gate last for high-K last, buffer layer last process is applied in this embodiment and the size of the first gate G1 is smaller than the size of the second gate G2 and the dielectric layer 122b in the first gate G1 will be entirely removed and replaced by a buffer layer and a dielectric layer having a high dielectric constant in later processes, so that even if the cleaning solution of the pre-cleaning process P3 does flow into the dielectric layer 122b, the formed semiconductor structure such as a transistor will not be affected. Moreover, even if processes such as a gate last for high-K first process is applied, a buffer layer formed by a thermal oxide process or a chemical oxide process will be denser than the previous dielectric layer 122b, and therefore will not be easily damaged by the cleaning solution.

Figure 10:
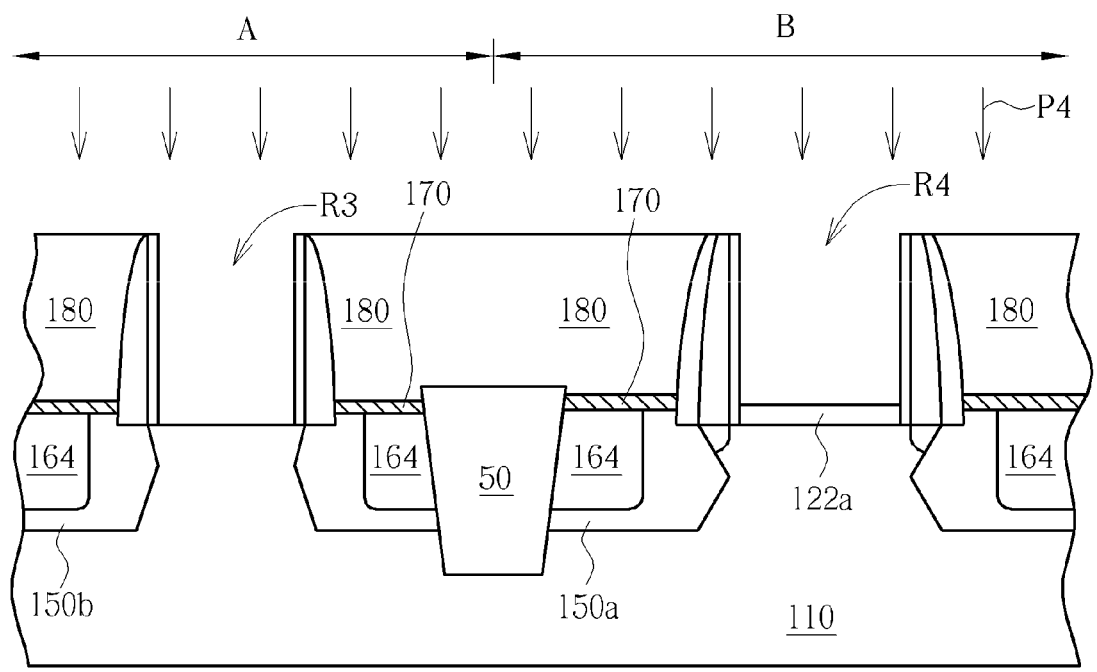

As shown in FIG. 10, a salicide process P4 is performed to respectively form a metal silicide 170 on each of the source/drain region 164. Then, a contact etch stop layer (CESL) is selectively formed, and an interdielectric layer (not shown) is covered and patterned to form an interdielectric layer 180 on the substrate 110 and expose the sacrificial electrode layer 124a and 124b. Thereafter, the sacrificial electrode layer 124a and 124b and the dielectric layer 122b in the first gate G1 are removed, and part of the dielectric layer 122a in the second gate G2 is selectively removed, thereby forming the recesses R3 and R4. Since the dielectric layer 122a is thicker than the dielectric layer 122b, most of the dielectric layer 122a will still remain when the dielectric layer 122b is entirely removed by an etching process, wherein the dielectric layer 122a has a "-"-shaped cross-sectional profile.

Figure 11:
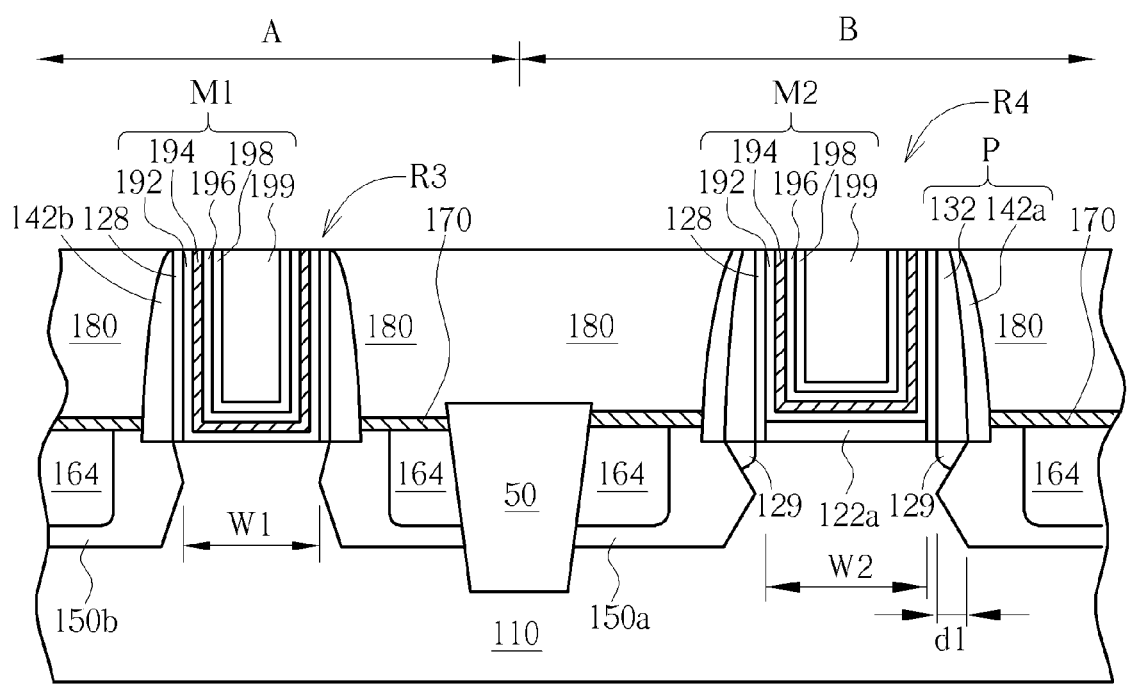

As shown in FIG. 11, a buffer layer (not shown), a dielectric layer having a high dielectric constant (not shown), a selective bottom barrier layer (not shown), a work function metal layer (not shown), a selective top barrier layer (not shown) and a low resistivity material (not shown) are sequentially formed in the recesses R3 and R4 and then are polished until the interdielectric layer 180 is exposed. A first metal gate M1 and a second metal gate M2 are formed at the positions of the first gate G1 and the second gate G2, wherein the first metal gate M1 and the second metal gate M2 all include a buffer layer 192, a dielectric layer having a high dielectric constant 194, a selective bottom barrier layer 196, a work function metal layer 198, a selective top barrier layer (not shown) and a low resistivity material 199. The first gate G1 and the second gate G2 are replaced by the first metal gate M1 and the second metal gate M2 by performing a metal gate replacement (RMG) process. The buffer layer 192, the dielectric layer having a high dielectric constant 194, the selective bottom barrier layer 196, the work function metal layer 198 and the selective top barrier layer (not shown) of the first metal gate M1 and the second metal gate M2 all have U-shaped cross-sectional profiles.

To summarize, the present invention provides a semiconductor structure and process thereof, which forms spacers having different thicknesses (by forming different numbers of layers, compositions or structures) on the substrate beside two gate structures, enabling epitaxial structures formed in the substrate beside the two spacers to have different spacing in the gate channel length direction (or have different distances between each epitaxial structure and each gate); thereby, electrical performances of transistors with different standards, in different electrical circuit areas for example, can be improved.

In one case, the distance between the epitaxial structures and a gate of a transistor in a logical electrical circuit area is disposed to be zero, while the distance between the epitaxial structures and a gate of a transistor in a high voltage electrical circuit area is disposed to be larger than zero by forming spacers with different thicknesses. In this way, a dielectric layer in the gate of the transistor in the high voltage electrical circuit area can be prevented from being damaged by a cleaning solution during cleaning processes. The epitaxial structures of the transistor in the logical electrical circuit area can also be closer to the gate, so that stresses in the gate channel in the logical electrical circuit area induced by the epitaxial structures can be increased.

The method of forming spacers with different thicknesses on the substrate beside the two gates may include the following steps. An internal spacer is formed on the substrate beside a gate, and then an outer spacer is formed on the internal spacer while a single spacer is formed on the other gate, wherein the materials of the internal spacer and the outer spacer (and the single spacer) may be common or different. Furthermore, a buffer layer may be formed between the internal spacer and the outer spacer to prevent the internal spacer from being damaged caused by over-etching the outer spacer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a first gate and a second gate located on a substrate;
   a first spacer and a second spacer respectively located only on the sidewalls of the first gate and the second gate; and
   two first epitaxial structures and two second epitaxial structures respectively located in the substrate beside the first spacer and the second spacer, wherein the first spacer and the second spacer have different thicknesses, and the spacing between the two first epitaxial structures is different from the spacing between the two second epitaxial structures.

2. The semiconductor structure according to claim 1, wherein the first spacer comprises a single spacer and the second spacer comprises a dual spacer.

3. The semiconductor structure according to claim 2, wherein the dual spacer comprises an internal spacer and an outer spacer.

4. The semiconductor structure according to claim 3, wherein the material of the outer spacer is common to the material of the first spacer.

5. The semiconductor structure according to claim 3, wherein the material of the outer spacer is different from the material of the internal spacer.

6. The semiconductor structure according to claim 3, further comprising:
   a buffer layer located between the internal spacer and the outer spacer.

7. The semiconductor structure according to claim 1, wherein the width of the first gate at the direction of the gate channel length is shorter than the width of the second gate at the direction of the gate channel length.

8. The semiconductor structure according to claim 1, wherein the first gate and the second gate are of the same conductive type.

9. The semiconductor structure according to claim 1, wherein the minimum distance between each of the first epitaxial structures and the first gate is shorter than the minimum distance between each of the second epitaxial structures and the second gate.

10. The semiconductor structure according to claim 9, wherein the minimum distance between each of the first epitaxial structures and the first gate is zero.

11. The semiconductor structure according to claim 1, wherein the first gate and the second gate all comprise a buffer layer and a dielectric layer having a high dielectric constant located on the substrate from bottom to top, and the second gate further comprises a dielectric layer located between the substrate and the buffer layer.

12. The semiconductor structure according to claim 11, wherein the buffer layer and the dielectric layer having a high dielectric constant all have U-shaped cross-sectional profiles and the dielectric layer has a "-"-shaped cross-sectional profile.

* * * * *